United States Patent
Rose

(10) Patent No.: US 7,321,124 B2
(45) Date of Patent: Jan. 22, 2008

(54) CORRECTOR FOR CORRECTING FIRST-ORDER CHROMATIC ABERRATIONS OF THE FIRST DEGREE

(75) Inventor: Harald Rose, Darmstadt (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 34 days.

(21) Appl. No.: 11/322,238

(22) Filed: Jan. 3, 2006

(65) Prior Publication Data

US 2006/0102848 A1 May 18, 2006

Related U.S. Application Data

(63) Continuation of application No. 10/927,119, filed on Aug. 27, 2004, now Pat. No. 7,012,262, which is a continuation of application No. 10/309,262, filed on Dec. 4, 2002, now Pat. No. 6,784,437.

(30) Foreign Application Priority Data

Dec. 4, 2001 (DE) ............................... 101 59 454

(51) Int. Cl.
*H01J 1/50* (2006.01)
*G01N 23/00* (2006.01)
*H01J 3/14* (2006.01)

(52) U.S. Cl. .................. 250/396 ML; 250/396 R; 250/311

(58) Field of Classification Search ............ 250/396 R, 250/396 ML, 311
See application file for complete search history.

(56) References Cited

U.S. PATENT DOCUMENTS

| 3,952,198 A | 4/1976 | Harada et al. ....... 250/396 ML |
| 4,389,571 A | 6/1983 | Crewe .................... 250/396 R |

(Continued)

FOREIGN PATENT DOCUMENTS

DE 42 04 512 8/1993

OTHER PUBLICATIONS

"Aberration correction in a low voltage SEM by a multipole corrector", by J. Zach et al, Nuclear Instruments and Methods in Physics Research A 363 (1995), pp. 316 to 325.

(Continued)

*Primary Examiner*—Robert Kim
*Assistant Examiner*—Johnnie L Smith, II
(74) *Attorney, Agent, or Firm*—Walter Ottesen

(57) ABSTRACT

The invention is directed to a corrector for correcting energy-dependent first-order aberrations of the first degree as well as third-order spherical aberrations of electron-optical lens systems. The corrector includes at least one quadrupole septuplet (S1) having seven quadrupoles (Q1 to Q7). The quadrupoles are mounted symmetrically to a center plane (ZS) so as to permit excitation along a linear axis. The corrector furthermore includes at least five octopoles (O1 to O7) which can be excited within the quadrupole septuplet. In an advantageous embodiment, two quadrupole septuplets are mounted in series one behind the other. The quadrupole fields of the two quadrupole septuplets are excited antisymmetrically to a center plane lying between the two quadrupole septuplets. With such a system, all geometric third-order aberrations and additional energy-dependent first-order aberrations of the third degree and geometric fifth-order aberrations of a lens system can be corrected in addition to the axial and off-axial first-order chromatic aberrations of the first degree.

15 Claims, 3 Drawing Sheets

U.S. PATENT DOCUMENTS

| | | | |
|---|---|---|---|
| 4,414,474 A | 11/1983 | Crewe | 250/396 R |
| 4,851,670 A | 7/1989 | Krivanek | 250/305 |
| 4,962,313 A | 10/1990 | Rose | 250/311 |
| 5,468,965 A | 11/1995 | Garnett et al. | 250/396 ML |
| 6,184,975 B1 | 2/2001 | Henstra et al. | 356/123 |
| 6,191,423 B1 | 2/2001 | Krijn et al. | 250/396 R |
| 6,605,810 B1 | 8/2003 | Haider et al. | 250/396 R |
| 6,642,675 B2 | 11/2003 | Ogasawara | 315/370 |
| 6,797,962 B1 | 9/2004 | Rose et al. | |
| 6,836,372 B2 | 12/2004 | Rose et al. | |
| 2004/0036031 A1* | 2/2004 | Rose et al. | 250/396 R |
| 2004/0155200 A1* | 8/2004 | Muller et al. | 250/396 R |
| 2005/0017194 A1* | 1/2005 | Matsuya et al. | 250/396 R |
| 2005/0023480 A1* | 2/2005 | Rose | 250/396 R |
| 2006/0219935 A1* | 10/2006 | Henstra | 250/396 ML |

OTHER PUBLICATIONS

"Minimisation of the aberrations of electrostatic lens systems composed of quadrupole and octupole lenses", by L.A. Baranova et al, International Journal of Mass Spectrometry 189 (1999), pp. 19 to 26.

* cited by examiner

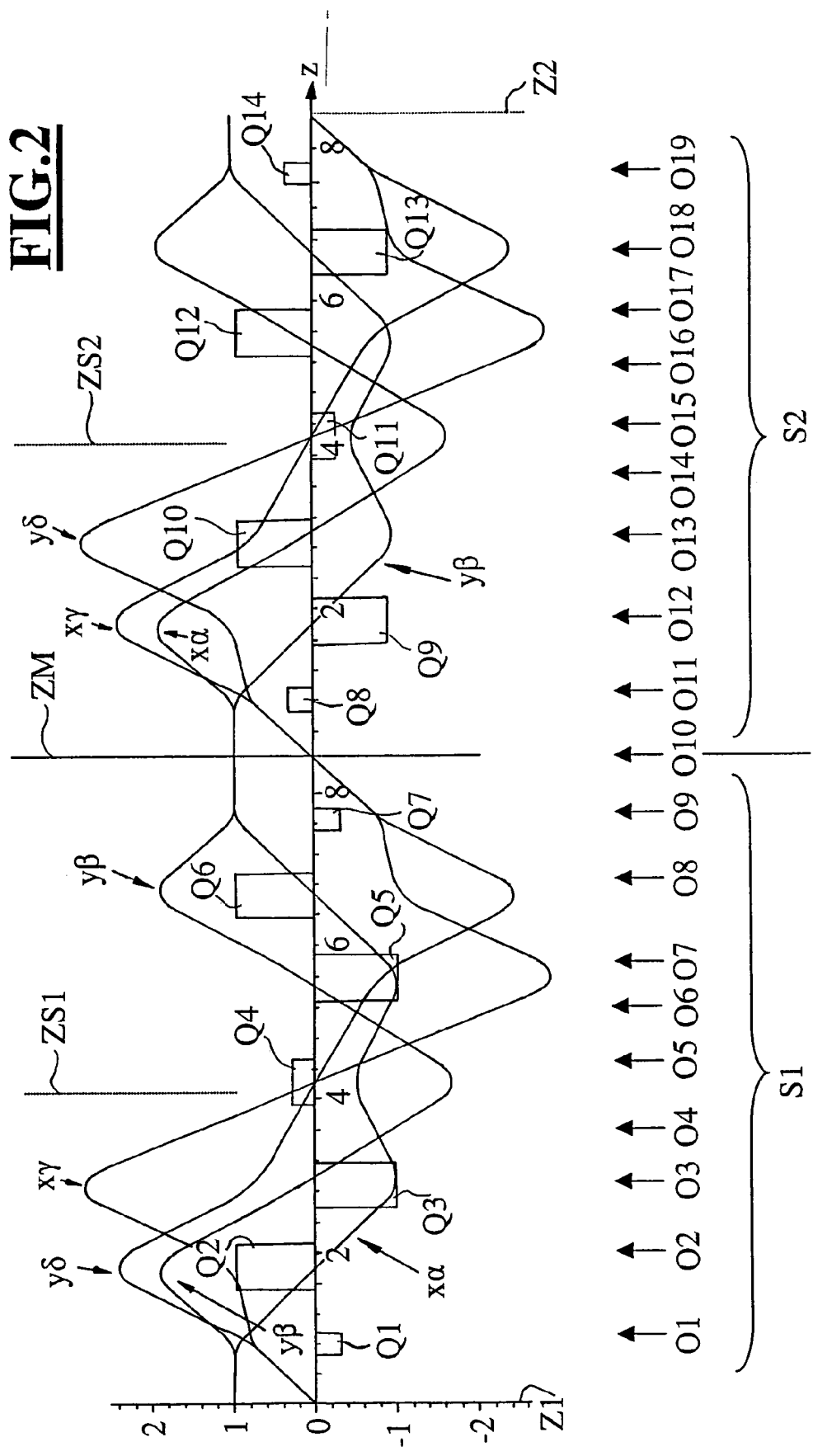

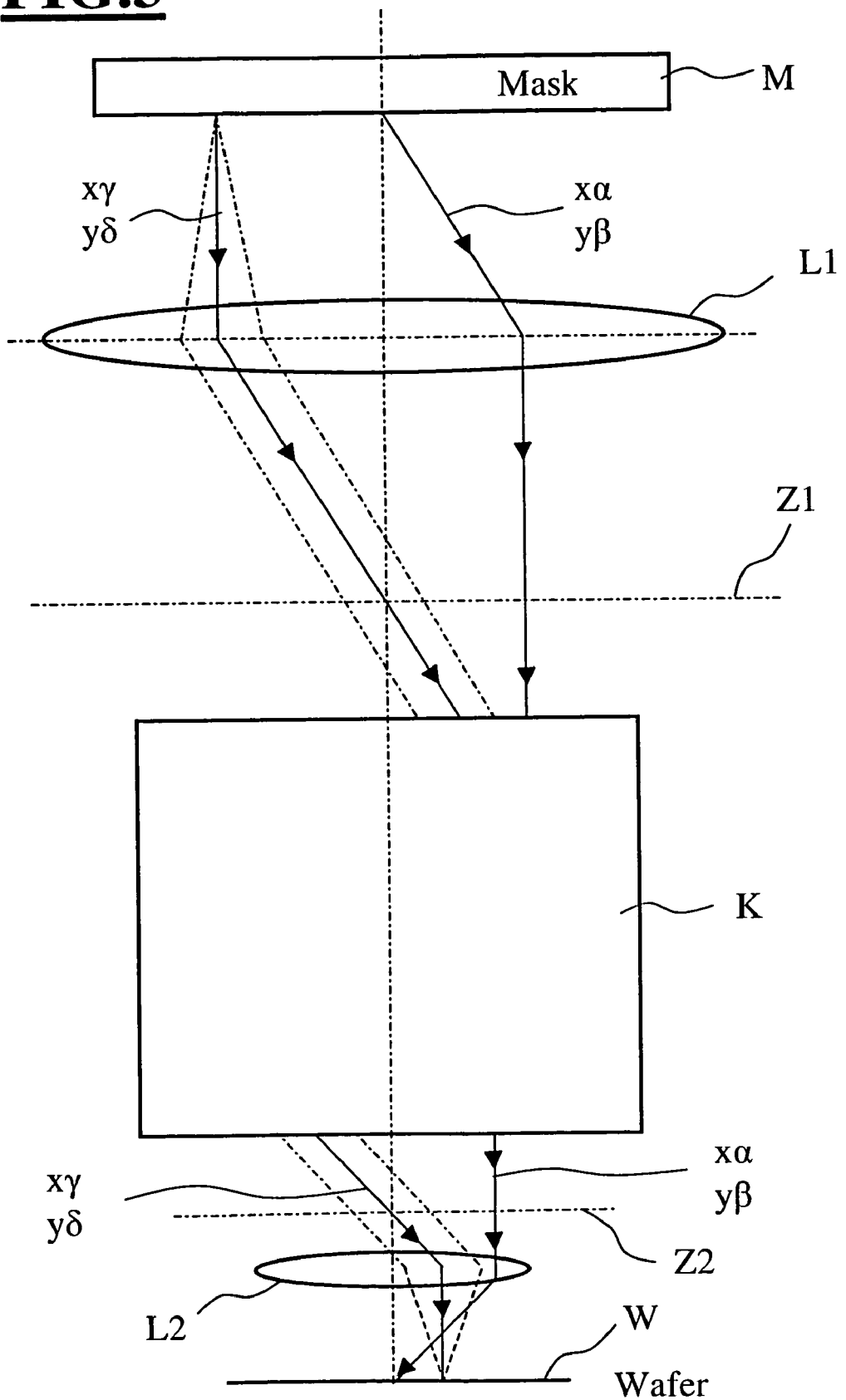

CORRECTOR FOR CORRECTING FIRST-ORDER CHROMATIC ABERRATIONS OF THE FIRST DEGREE

CROSS REFERENCE TO RELATED APPLICATIONS

This is a continuation application of application Ser. No. 10/927,119, filed Aug. 27, 2004 now U.S. Pat. No. 7,012,262, which is, in turn, a continuation application of application Ser. No. 10/309,262, filed Dec. 4, 2002 (U.S. Pat. No. 6,784,437), claiming priority from German patent application 101 59 454.2, filed Dec. 4, 2001, and incorporated herein by reference.

FIELD OF THE INVENTION

The invention relates to a corrector for correcting first-order chromatic aberrations of the first degree as well as geometric third-order aberrations of electron-optical lens systems.

BACKGROUND OF THE INVENTION

A corresponding corrector is disclosed in German patent publication 4,204,512. The corrector includes a total of six quadrupoles and octopoles superposed on the quadrupoles. The potentials of the quadrupoles are excited anti-symmetrically to a center plane. An additional octopole is mounted in the center plane. The corrector defines a telescopic system. With this corrector, the third-order spherical aberration and the off-axis first-order chromatic aberration of the first degree of an electron-optical lens system can be corrected. A correction of the coma of a skewed beam is possible with this system in that the coma-free point of the lens, which is to be corrected, is placed at the nodal point of the corrector. The following cannot be corrected with this corrector: off-axis geometric third-order aberrations such as the astigmatism of skewed beams; the distortion; and, the image field curvature. In total, this corrective device can therefore be used only for systems having relatively small image fields such as are conventional in transmission electron microscopes. In contrast, this corrective device cannot be used in combination with systems which require large image fields such as in electron projection lithography.

SUMMARY OF THE INVENTION

It is an object of the invention to provide a corrector with which the axial and off-axis energy-dependent first-order aberrations of the first degree of an electron-optical lens system as well as the third-order spherical aberrations can be corrected and which can also be expanded to correct: the distortion, image field curvature, and the astigmatism of skewed beams of the electron-optical lens system. In an advantageous embodiment of the invention, the axial and off-axial energy-dependent first-order aberrations of the second degree and all geometric third-order aberrations should be correctable at least for a specific plane.

The corrector of the invention is for correcting energy-dependent first-order aberrations of the first degree and third-order spherical aberrations of an electron-optical lens system. The corrector includes: a quadrupole-septuplet including at least seven quadrupoles defining a center plane (ZS); the quadrupoles being excitable symmetrically to the center plane (ZS) along a linear axis; and, at least five octopoles excitable within the quadrupole-septuplet.

The corrector according to the invention includes at least seven quadrupoles, that is, a quadrupole-septuplet along a linear axis which are excitable symmetrically to a center plane along the linear axis. Furthermore, at least five octopole fields can be excited in the corrector of the invention at various locations within the corrector.

According to the invention, it was recognized that, in a system having only seven quadrupoles, all axial or off-axial fundamental paths can run either symmetrically or antisymmetrically to the center plane of the corrector. With this symmetry, it is possible to correct spherical aberrations without additionally introducing coma and distortion. If the lens system, which is to be corrected, has a coma, the zero crossovers of the field paths of the corrector are to be placed at the coma-free point of the lens system or lens so that the entire system is also free of coma.

Of the total of seven quadrupoles, at least three should be electromagnetic, that is, there should be a superposition of electrostatic and magnetic quadrupole fields. With the electromagnetic quadrupoles, the correction of the axial energy-dependent aberrations is possible without introducing off-axial energy-dependent aberrations. Because of the symmetry of the quadrupoles, no off-axial energy-dependent aberrations are introduced in the nodal plane in which the field rays have a zero crossover. This nodal plane thereby defines an achromatic plane of the corrector and simultaneously a coma-free plane of the corrector.

If an arrangement of the nodal plane of the corrector is not possible in the achromatic plane of the imaging system, which is to be corrected, then off-axial energy-dependent aberrations can be obtained via a suitable distribution of the magnetic and electric quadrupole intensities in that the electric quadrupole intensities have a component, which is antisymmetric to the symmetry plane of the septuplet which is in magnitude equal but of inverse polarity to a component of the magnetic quadrupole intensities which is antisymmetric to the symmetry plane of the septuplet. The total quadrupole intensity is then again symmetrical to the symmetry plane of the septuplet. The symmetrical component of the electric and magnetic quadrupole intensities is so adjusted with respect to the ratio of the intensities to each other that the axial chromatic aberration is corrected and the antisymmetrical component of the electric and magnetic quadrupole intensities is so adjusted in the ratio of the intensities to each other that the off-axial chromatic aberrations are corrected.

The octopoles should be excited symmetrically to the center plane of the quadrupole septuplet so that the corrector does not introduce an additional coma and distortion.

In order to correct the three components of the spherical aberration as independently as possible from each other, a first octopole pair should be excitable in the region of the first and last quadrupole, a second octopole pair should be excitable in the region of the second and sixth quadrupole and a third octopole should be excitable in the region of the center quadrupole. As an alternative to the excitation of the octopole in the region of the center quadrupole, it is however also possible to excite an additional octopole pair in the region of the third and fifth quadrupoles. An especially favorable decoupling of the components of the spherical aberration is achieved when the octopole fields are spatially superposed on the quadrupole fields; however, this is not absolutely necessary and especially slight position deviations are not critical.

It is especially advantageous to mount two geometrically equal quadrupole septuplets serially one behind the other along the linear axis. With such an arrangement, it is then possible to correct all geometric third-order aberrations as well as the axial energy-dependent first-order aberrations of the first degree and first-order aberrations of the second degree. An especially decoupled correction of all geometric third-order aberrations is achieved when an additional octopole is excitable in the mid plane between the quadrupole septuplets.

The corrector has two specific excitation modes for the octopoles: in a first specific excitation mode, the octopole fields are excitable in each quadrupole septuplet symmetrically to the center plane of the particular quadrupole septuplet and the octopoles of both quadrupole septuplets are excited symmetrically to the center plane between the quadrupole septuplets. In this mode of operation, the corrector is free of coma and free of distortion, that is, the corrector does not introduce additional coma or distortion.

In the second specific excitation mode, the octopoles in each quadrupole septuplet are excited antisymmetrically to the center plane of the particular quadrupole septuplet and the octopole fields of both quadrupole septuplets are excited antisymmetrically to the plane between the quadrupole septuplets. In this operating mode, no additional spherical aberration, no image field curvature and no astigmatism of skewed beams are additionally generated by the corrector. The operating mode selected is dependent upon the symmetry characteristics of the electron-optical lens system to be corrected. The image field curvature and the spherical aberration of electron-optical round lens systems are unavoidable. For this reason, in practice, the excitation of the octopole fields always has a symmetrical component. The geometric third-order aberrations of any round lens system can be, in principle, corrected by suitable superposition of symmetrical and antisymmetrical components of the octopole excitations.

Furthermore, it is advantageous to mount a further octopole which can be excited in the mid plane between the quadrupole septuplets. With this additional octopole together with the excitations of the two octopoles in the symmetry planes of the quadrupole septuplets, it is possible to correct the spherical aberration substantially independently of off-axial image aberrations.

Furthermore, it is advantageous to generate the octopole fields or at least a portion of the octopole fields by the excitation of twelve poles or multipoles of higher order so that the orientation of the octopole fields is rotatable electrically about the linear axis. In this way, it is possible to correct the azimuth components of the coma, of the astigmatism of skewed beams and of the distortion.

Furthermore, it is additionally possible to also generate, in addition to the quadrupole fields and octopole fields, hexapole fields with the aid of the twelve poles by correspondingly exciting the individual multipole fields. With the aid of the hexapole fields, a portion of the fifth-order aberrations can be compensated.

Furthermore, it is advantageous when at least a portion of the octopole fields are electromagnetic, that is, likewise comprise a superposition of crossed electric and magnetic octopole fields. In this way, the energy-dependent first-order aberrations of the third degree can be partially corrected and therefore reduced.

Furthermore, it is advantageous to generate six multipole fields in order to correct the dominant geometric fifth-order aberrations.

The axial and off-axial fundamental paths should be symmetrical or antisymmetrical to the center plane of the particular quadrupole septuplet in each quadrupole septuplet in the corrector according to the invention.

The course of the fundamental paths in the XZ section of the first septuplet corresponds to the trace of the corresponding fundamental paths in the YZ section of the second septuplet and vice versa as noted in German patent publication 4,204,512 referred to initially herein.

A corresponding corrector with which all third-order aberrations and the energy-dependent first-order aberrations of the first degree can be corrected includes at least fourteen quadrupole fields and fifteen octopole fields which are excitable along the linear axis at different suitable locations.

A corresponding corrector preferably is applicable within an electron-optical imaging system as used, for example, in electron projection lithography and images a first plane demagnetized into a second plane. Such an electron-optical imaging system has at least two lenses and the corrector is mounted between these lenses.

BRIEF DESCRIPTION OF THE DRAWINGS

The invention will now be described with reference to the drawings wherein:

FIG. 2 is a schematic of a second embodiment of the corrector of the invention which is assembled with two correctors corresponding to the corrector shown in FIG. 1; and, FIG. 3 is a schematic of an electron-projection system having a corrector according to the invention.

DESCRIPTION OF THE PREFERRED EMBODIMENTS OF THE INVENTION

Figure 1:
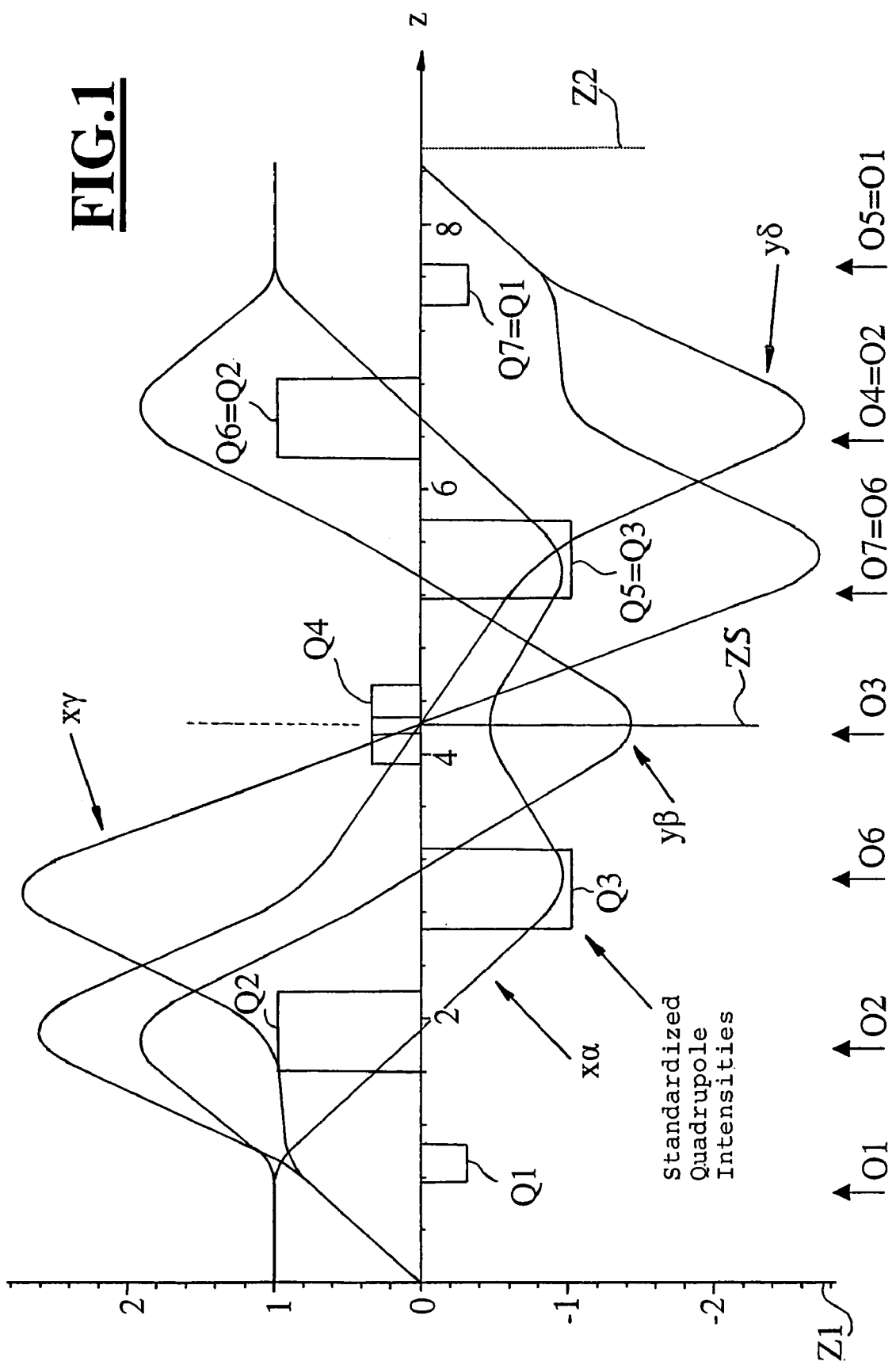
FIG. 1 is a schematic of a first embodiment of the corrector according to the invention showing the course of the fundamental paths within the corrector.

In FIG. 1, the traces and the intensities of the quadrupole fields (Q1 to Q7) are shown excited along a linear axis. The quadrupoles (Q1 to Q7) are symmetrical to the center symmetry plane ZS. The symmetry plane ZS defines a plane of symmetry with respect to the quadrupole fields as well as with respect to the fundamental paths. As symmetry planes, those planes are understood with respect to which the quadrupole potentials are symmetrical and the paraxial paths are symmetrical or anti-symmetrical.

A portion of the quadrupoles (Q1 to Q7) should be electromagnetic, that is, at least three quadrupole pairs should be electromagnetic in each of the two mutually symmetrical halves of the corrector. More specifically, these at least three quadrupole pairs should comprise the superposition of mutually perpendicular electrostatic and magnetic quadrupole fields in order to correct the axial chromatic aberration. With the exception of the two outer quadrupoles (Q1, Q7), all remaining quadrupoles are suitable for this purpose because the axial spacings of the axial fundamental paths ($X\alpha$, $Y\beta$) differ there to a great extent. The field paths, that is, the off-axial paths, are conventionally identified by $X\gamma$ and $Y\delta$. The field paths ($X\gamma$, $Y\delta$) are antisymmetrical and the axial paths ($X\alpha$, $Y\beta$) are symmetrical to the symmetry plane ZS. The nodal planes of the telescopic system of the corrector are identified by Z1 and Z2, respectively. The nodal planes (Z1, Z2) are characterized in that an object, which is disposed in one of the nodal planes, is imaged into the other nodal plane at an imaging scale of 1:1.

In order to correct the three components of the third-order spherical aberration, five octopoles (O1 to O5) are needed while maintaining the symmetry. The octopoles (O1 to O5) are indicated by the corresponding arrows. The positions of the individual octopoles along the axis Z are so selected with reference to the course of the fundamental paths that the three components of the spherical aberration can be corrected substantially independently of each other. An octopole pair (O1, O5) is mounted at locations whereat the beam has substantial rotational symmetry as in the regions ahead of the first quadrupole Q1 and rearward of the last quadrupole Q7. For reasons of construction, it is also possible to superpose the octopoles on the first and last quadrupoles (Q1, Q7). In this way, a superposition of the octopole field with a round lens field is also avoided forward and rearward of the corrector. Additional octopole pairs (O2, O4, O3) are preferably positioned in regions of astigmatic intermediate images, that is, at the zero crossovers of one of the fundamental paths because, in this way, a substantial decoupling of the aberration correction is ensured.

In lieu of an octopole O3 in the symmetry plane ZS, also two octopoles (O6, O7) can be superposed on the third or fifth quadrupoles, respectively, as shown in FIG. 1. Furthermore, it is possible to split the quadrupole Q4, which is mounted in the region of the symmetry plane ZS, into two spatially separated quadrupoles.

In FIG. 2, a total system is shown which comprises two quadrupole septuplet component systems (S1, S2) corresponding to the quadrupole septuplet shown in FIG. 1. Each of the septuplet component systems is configured symmetrically to its own septuplet symmetry plane (ZS1, ZS2); however, both septuplet component systems (S1, S2) are, with respect to the quadrupole intensity, antisymmetrical to the mid plane ZM of the total system. The total system has a total of fourteen quadrupoles (Q1 to Q14) and nineteen octopoles (O1 to O19). The octopoles are here again indicated by the arrows (O1 to O19). The antisymmetry of the total system with respect to the mid plane ZM causes an exchange or permutation of the fundamental paths in the XZ section and YZ section of the two component systems, that is, for example, the course of the $X\alpha$ path in the first septuplet S1 corresponds to the course of the $Y\beta$ path in the second septuplet S2 and vice versa. The same applies to the field paths $Y\delta$ and $X\gamma$. As a supplement to FIG. 1, the placement of an additional octopole O4 between the third and fourth quadrupoles (Q3, Q4) and, in correspondence to the symmetry, the placement of an additional octopole O6 between the fourth and fifth quadrupoles (Q4, Q5) in the first septuplet S1 and the placement of corresponding symmetrical octopoles O14 and O16 in the second septuplet S2 as well as the placement of an octopole O10 in the center plane ZM makes possible the complete correction of all geometric third-order aberrations. Because of the larger number of possible electromagnetic quadrupoles in the embodiment of FIG. 2 and the increased symmetry, also the first-order chromatic aberrations of the second degree can be corrected in this embodiment so that the total system becomes apochromatic.

As shown in FIG. 2, the fundamental beam paths ($X\alpha$, $Y\beta$) are symmetrical with respect to the center plane ZM and are at the same distance from the optical axis Z at octopoles O5 and O15. Likewise, the fundamental beam paths ($Y\beta$, $X\alpha$) are at the same distances from the optical axis at octopoles O5 and O15. The off-axial field paths ($X\gamma$, $Y\delta$) intersect the optical axis at octopoles O5 and O15, respectively. Accordingly, the octopole O5 of the first subsystem S1 is imaged onto octopole O15 of the second subsystem S2.

As noted above, the antisymmetry of the total system with respect to the mid plane ZM causes an exchange or permutation of the fundamental paths in the XZ section and YZ section of the two subsystems (S1, S2). The same applies to the field paths.

The excitation of the quadrupole fields takes place in that these have a two-section symmetry so that the main sections of all quadrupoles lie in a common planar section. A section is an area in which the optical axes lie. As planes, planar surfaces are understood which lie perpendicularly to the optical axes as, for example, the symmetry planes (ZS1, ZS2) and the mid plane ZM. With the introduction of the symmetry in the planes and sections, the number of linear independent third-order aberration coefficients of the quadrupole system in FIG. 2 is reduced to five linear independent coefficients. Because of the two-section symmetry, the potentials of the quadrupoles are dependent upon $x^2$ and $y^2$ (while round lens potentials are dependent only upon $x^2+y^2$). Because of the symmetry/antisymmetry of the fundamental paths, the azimuthal aberration coefficients of the corrector vanish. As a consequence of the antisymmetry of the field paths and the symmetry of the axial paths with respect to the symmetry planes (ZS1, ZS2), all terms vanish which unevenly contain the sum of the exponents of the field paths wherefrom there results the situation that the coma and the distortion as well as the chromatic dependency of the magnification of the individual symmetrical quadrupole system, that is, of an individual quadrupole septuplet, vanish.

In FIG. 3, a corrector of the invention is shown in combination with a telecentric duplet system as used in the area of the electron projection lithography. The telecentric duplet contains a first magnetic lens L1 having a forward focal plane in which the mask M, which is to be imaged, is mounted. The forward nodal plane Z1 of the corrector is coincident with the rearward focal plane of the first lens L1. After the corrector K, a second magnetic lens L2 follows whose forward focal plane is coincident with the rearward nodal plane Z2 of the corrector K. The image W of the mask M is formed in the rearward focal plane of the second magnetic lens L2 wherein the wafer to be exposed is positioned. The magnification or demagnification of the total system is determined by the ratio of the focal lengths of the two magnetic lenses L1 and L2. By scaling the fields of the two lenses (L1, L2) in correspondence to the magnification and because of mutually opposing flow directions in both lenses, the Larmor rotation of the total system vanishes as do the isotropic and anisotropic components of the distortion and of the chromatic aberration of the magnification.

With the corrector K having the configuration shown in FIG. 2, all geometric third-order aberrations as well as the first-order chromatic aberration of the first degree as well as the first-order chromatic aberration of the second degree of the total system can be corrected. The total system defines an apochromat which is free of all geometric image aberrations of the third order. This apochromat makes possible the imaging of large object fields while simultaneously providing a large energy band of the imaging electrons.

With the realization of the apochromatic system, it is advantageous to not completely correct the first-order chromatic aberration of the first degree, rather, to so adjust the same that the residual aberration of the first-order chromatic aberration of the second degree holds the remaining first-order chromatic aberration of the third degree as small as possible for an energy bandwidth as wide as possible.

It is understood that the foregoing description is that of the preferred embodiments of the invention and that various changes and modifications may be made thereto without departing from the spirit and scope of the invention as defined in the appended claims.

What is claimed is:

1. A corrector for correcting aberrations of an electron optical system, the corrector comprising:
    a first subsystem including a first plurality of quadrupoles generating quadrupole fields and at least one octopole;
    a second subsystem including a second plurality of quadrupoles generating quadrupole fields and at least one octopole;
    said first subsystem defining an entrance side of said corrector and said second subsystem defining an exit side of said corrector;
    said first and second quadrupole systems conjointly imaging a first nodal plane on said entrance side of said corrector into a second nodal plane on said exit side of said corrector; and,
    said at least one octopole of said first subsystem and said at least one octopole of said second subsystem being arranged in astigmatic intermediate image planes of said first nodal plane between said first and said second nodal planes.

2. The corrector of claim 1, wherein an octopole of said first subsystem is imaged onto an octopole of said second subsystem.

3. The corrector of claim 1, wherein said quadrupole fields of said first subsystem and said quadrupole fields of said second subsystem are excitable antisymmetrically to each other.

4. The corrector of claim 1, wherein first and second subsystems conjointly define an optical axis; and, said octopole of said first subsystem is imaged onto said octopole of said second subsystem with different magnifications in different directions transverse to said optical axis.

5. The corrector of claim 4, wherein said first subsystem and said second subsystem conjointly define a mid-plane; and, wherein two axial and/or two off-axial fundamental paths run symmetrically or antisymmetrically to said mid-plane.

6. The corrector of claim 5, wherein fundamental paths in a first section of the first subsystem correspond to traces of corresponding fundamental paths in a section transverse to said first section of said second subsystem.

7. The corrector of claim 5, wherein said optical axis is a linear optical axis; said two axial and said two off-axial fundamental paths define four fundamental paths; and, wherein said at least one octopole of said first subsystem is arranged in a plane in which two of said four fundamental paths cross said linear optical axis.

8. The corrector of claim 1, wherein said first subsystem images said first nodal plane into a plane between said first subsystem and said second subsystem.

9. The corrector of claim 5, further comprising a further octopole arranged in said mid-plane.

10. The corrector of claim 1, wherein said first subsystem comprises at least one further octopole and wherein said second subsystem comprises at least one second further octopole.

11. The corrector of claim 1, wherein said first plurality of quadrupoles and said second plurality of quadrupoles each comprise at least four quadrupoles.

12. The corrector of claim 5, wherein said second subsystem is arranged antisymmetrically to said first subsystem with respect to said mid-plane.

13. An electron optical system comprising:
    a lens arrangement;
    a corrector for correcting aberrations of said lens arrangement;
    said corrector including:
    a first subsystem including a first plurality of quadrupoles generating quadrupole fields and at least one octopole;
    a second subsystem including a second plurality of quadrupoles generating quadrupole fields and at least one octopole;
    said first subsystem defining an entrance side of said corrector and said second subsystem defining an exit side of said corrector;
    said first and second quadrupole systems conjointly imaging a first nodal plane on said entrance side of said corrector into a second nodal plane on said exit side of said corrector; and,
    said at least one octopole of said first subsystem and said at least one octopole of said second subsystem being arranged in astigmatic intermediate image planes of said first nodal plane between said first and said second nodal planes.

14. The electron optical system of claim 13, wherein said lens arrangement has a diffraction plane; and, wherein said at least one octopole of said first subsystem is arranged in a plane into which said diffraction plane is imaged.

15. The electron optical system of claim 13, wherein said quadrupole fields of said first subsystem and said quadrupole fields of said second subsystem are excitable antisymmetrically to each other.

* * * * *